US008560756B2

(12) United States Patent
Yang et al.

(10) Patent No.: US 8,560,756 B2
(45) Date of Patent: Oct. 15, 2013

(54) HYBRID FLASH MEMORY DEVICE

(75) Inventors: Nian Yang, Mountain View, CA (US); Jiang Li, San Jose, CA (US); Fan Wan Lai, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 822 days.

(21) Appl. No.: 11/873,810

(22) Filed: Oct. 17, 2007

(65) Prior Publication Data

US 2009/0106481 A1 Apr. 23, 2009

(51) Int. Cl.
*G06F 12/00* (2006.01)
(52) U.S. Cl.
USPC ............... 711/5; 711/101; 711/103; 711/114; 711/148; 711/173
(58) Field of Classification Search
USPC .................. 711/5, 101, 103, 114, 148, 173
See application file for complete search history.

(56) References Cited

U.S. PATENT DOCUMENTS

| | | | | |
|---|---|---|---|---|
| 4,821,185 A | * | 4/1989 | Esposito | 710/52 |
| 5,777,925 A | * | 7/1998 | Tokushige | 365/185.11 |
| 6,425,041 B1 | * | 7/2002 | Klein | 710/306 |
| 6,724,682 B2 | * | 4/2004 | Lee et al. | 365/230.06 |
| 6,937,513 B1 | * | 8/2005 | Desai et al. | 365/185.11 |
| 7,177,190 B2 | * | 2/2007 | Lee | 365/185.17 |
| 7,208,382 B1 | * | 4/2007 | Erhardt et al. | 438/301 |
| 2005/0226054 A1 | * | 10/2005 | Yeh et al. | 365/185.28 |
| 2008/0031050 A1 | * | 2/2008 | Yoon et al. | 365/185.18 |
| 2008/0266129 A1 | * | 10/2008 | Chiang | 340/686.1 |

FOREIGN PATENT DOCUMENTS

WO    WO 2007049850 A1 *  5/2007

OTHER PUBLICATIONS

Park, Chanik et al., Compiler Assisted Demand Paging for Embedded Systems with Flash Memory, 2004.*
IEEE 100, The Authoritative Dictionary of IEEE Standards Terms, Seventh Edition, 2000, pp. 85 and 685, Published by The Institute of Electrical and Electronics Engineering, Inc. 3 Park Avenue, New York, NY, 10016-5997, USA.*

* cited by examiner

*Primary Examiner* — Reginald Bragdon
*Assistant Examiner* — Gurtej Bansal
(74) *Attorney, Agent, or Firm* — Turocy & Watson, LLP

(57) ABSTRACT

A hybrid memory system is provided that combines the advantages of NAND flash memory devices with the advantages of NOR flashes memory devices. The system includes a NAND flash memory portion to provide mass storage and fast programming/erasure capabilities of conventional NAND flash memory devices. The system further comprises a NOR flash memory portion to provide code storage and fast random reading capabilities of conventional NOR flash memory devices. Accordingly, the hybrid memory system provides both mass storage and code storage along with fast programming/erasure speeds and fast random access speeds.

20 Claims, 10 Drawing Sheets

HYBRID FLASH MEMORY DEVICE

BACKGROUND

There are two types of flash memory devices, those based on NOR gates (NOR flash memory) and those based on NAND gates (NAND flash memory). A modern NOR memory cell may employ two gates, a control gate and a floating gate. The charge held in the floating gate partially screens the electric field from the control gate to establish and control the threshold voltage of the cell. Depending on the threshold voltage of the cell, a read-out voltage applied to the control gate will either result in a conducting channel (e.g., producing a current) or an insulated channel (e.g., producing no current). Stored data can then be interpreted from the absence or presence of a current. In modern NOR flash, the default state is a logical "1" because a current flows in the default state. The cell can be programmed to a "0" value via hot-electron injection of the floating gate and erased by applying a large voltage of opposite polarity. Modern NOR flash is partitioned into erase block such that the entire block must be erased to erase a single cell within the block. Accordingly, a rewrite programming or erasing operation incurs significant penalty. Modern NAND flash may employ tunnel injection to write data to a cell and tunnel release to erase data from a cell.

In typical NOR flash, cells are connected in parallel to the bit lines. Thus, cells can be read and programmed individually. Accordingly, reading from NOR flash is similar to reading from random access memory (RAM). Thus, NOR flash is suitable for software storage and execution similar to read only memory (ROM) and RAM. In typical NAND flash, the cells are connected in series to the bit lines. This prevents the cells from being read and programmed individually. Rather, the cells in the series must be read together at once. The series connection enables large grids of NAND flash memory cells in a small area resulting in high density memory suitable for mass storage. Programming and reading is performed on a page basis enabling large data transfers of blocks of data similar to hard disks.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The subject matter disclosed and claimed herein, in one aspect thereof, comprises a memory device system that provides fast programming and erasing capabilities suitable for mass storage as well as fast random reading capabilities suitable for software code storage. In particular, the system provides a hybrid of NAND flash memory and NOR flash memory. The system comprises a NAND memory component and a NOR memory component. The NAND memory component is configured for mass storage of data and provides fast programming and erasing speeds. The NOR memory component is configured for code storage and provides fast random reading speeds.

The memory device is high density with multiple memory banks. The majority of the memory banks are allocated to the NAND memory component to facilitate mass data storage. In accordance with an aspect of the subject disclosure, a single memory bank is provided to the NOR memory component to be utilized for code storage. The designated memory bank for the NOR memory component can be the memory bank in closest proximity to the X-decoder of the memory device. In accordance with another aspect of the subject disclosure, the NOR memory component can be duplicated as necessary (i.e., provided with additional memory banks) to meet the requirements of particular applications.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

DETAILED DESCRIPTION

Figure 1:
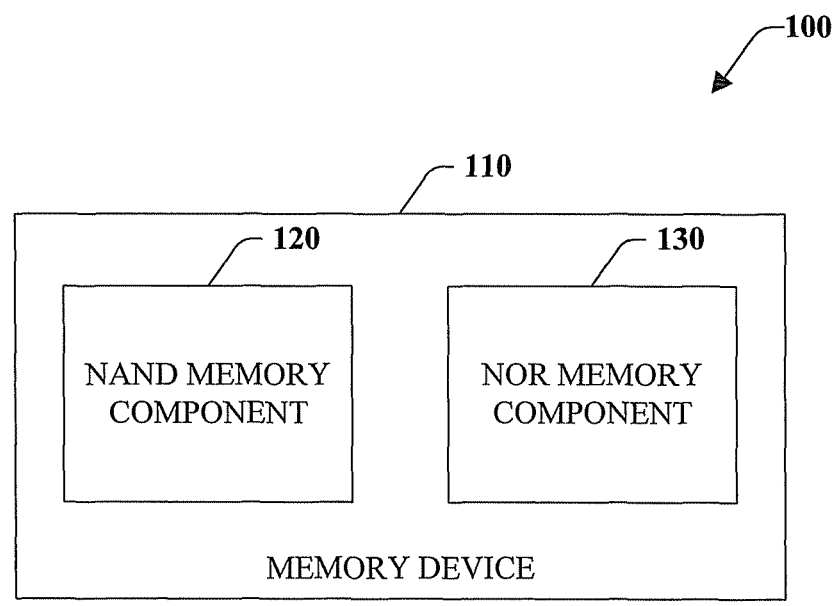
FIG. 1 illustrates a block diagram of a hybrid memory device in accordance with one aspect of the invention.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof.

Referring initially to FIG. 1, a memory device system 100 is illustrated. The system 100 includes a memory 110 that facilitates storage and retrieval of data for a variety of applications. For example, memory device 110 can be employed in portable flash drive devices, laptop computers, personal computers, cell phones, personal digital assistants (PDAs), other mobile devices, and the like. Memory device 110 includes a NAND memory component 120 and a NOR memory component 130. It is to be appreciated that NAND component 120 can be implemented as an ORNAND memory array. NAND memory component 120 (or ORNAND memory) is suitable for mass storage of data. NAND memory component 120 provides high programming and erasure speed. Programming relates to writing a bit of data (e.g., "0" or "1") to a memory cell and erasure relates to erasing a bit of data previously stored in the memory cell.

Memory device 110 also includes the NOR memory component 130. Conventional NOR type flash memory is suitable for code storage. Code can be, for example, executable software that is read and executed from the memory device 110. NOR memory component 110 provides high speed random read access. Accordingly, it is desired for code storage wherein fast random access is critical for high performance of the stored software. For example, NOR memory is suitable for storing firmware, boot code, operating systems, and other such data that needs to be changed infrequently.

Due to intrinsic architecture limitations, conventional NAND memory cannot be fully employed as NOR memory. In other words, NAND memory component 120 does not offer high performance random read suitable for code storage and execution. Similarly, NOR memory component 130 provides high performance random read but write throughput that is lower than NAND memory component 120. Accordingly, memory device 110, by including both the NAND memory component 120 and NOR memory component 130, provides high performance random read capabilities and high density high write throughput. Thus, a computing device can employ memory device 110 alone instead of utilizing two or more memory devices to achieve both aspects. For example, a smart phone or PDA device has high storage needs and a demanding set of application performance requirements. Thus, the optimal design of such smart phone or PDA calls for both NOR and NAND memory. The smart phone or PDA can employ memory device 110 to provide such functionality as opposed to employing separate NAND memory and NOR memory. True mass and code storage is achieved on a single chip implementing memory device 110.

Figure 2:
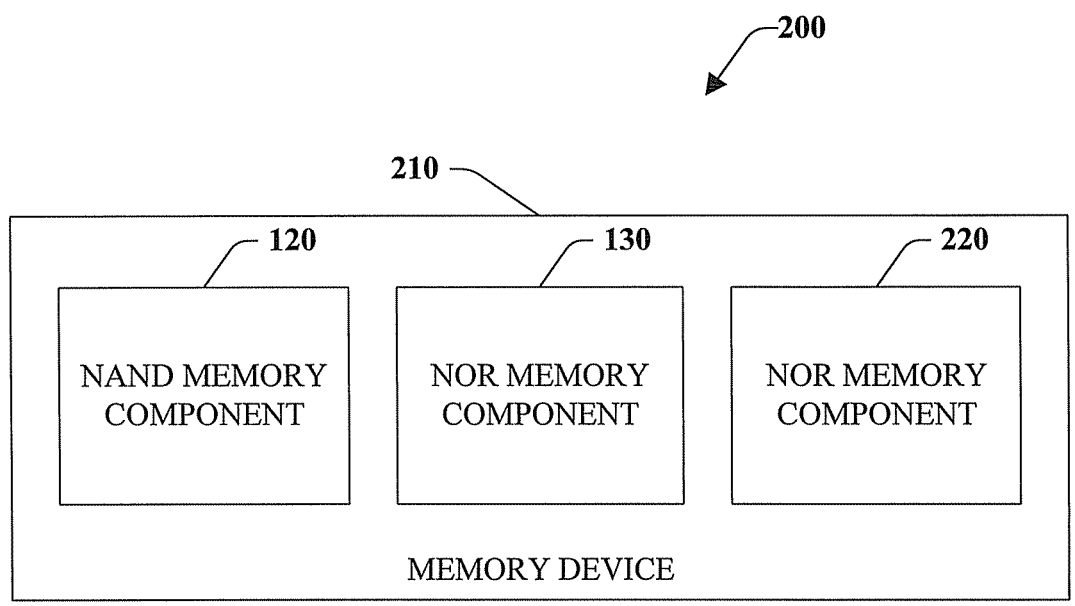
FIG. 2 illustrates a block diagram of a hybrid memory device with a duplicated NOR structure in accordance with another aspect of the invention.

Turning briefly to FIG. 2, a memory device system 200 is depicted. System 200 includes a memory device 210 comprising a NAND memory component 120 and a NOR memory component 130. A typically NOR memory device is utilized primarily for code storage and execution. Typically, a small amount of code is stored. Accordingly, the memory array can be around 128 megabytes (MB). Accordingly to one aspect of the subject disclosure, memory device 210 combines NAND memory and NOR memory on a single chip. Since chip area is a limited resource, the respective sizes of the NAND portion and NOR portion must be strictly controlled. In certain applications, a single NOR component with a size of 128 MB can be includes on memory device 210 and the remaining chip area is devoted to a high density NAND component having high storage capacity. However, it is to be appreciated that different applications may require additional random access memory capacity. The NOR component may not be enlarged directly without impacting performance. Accordingly, additional NOR components can be introduced. Memory device 210 includes a second NOR memory component 220. NOR memory component 220 can be substantially similar to NOR memory component 130. The modular architecture of NOR memory enables additional NOR memory components to be introduced as needed.

Figure 3:
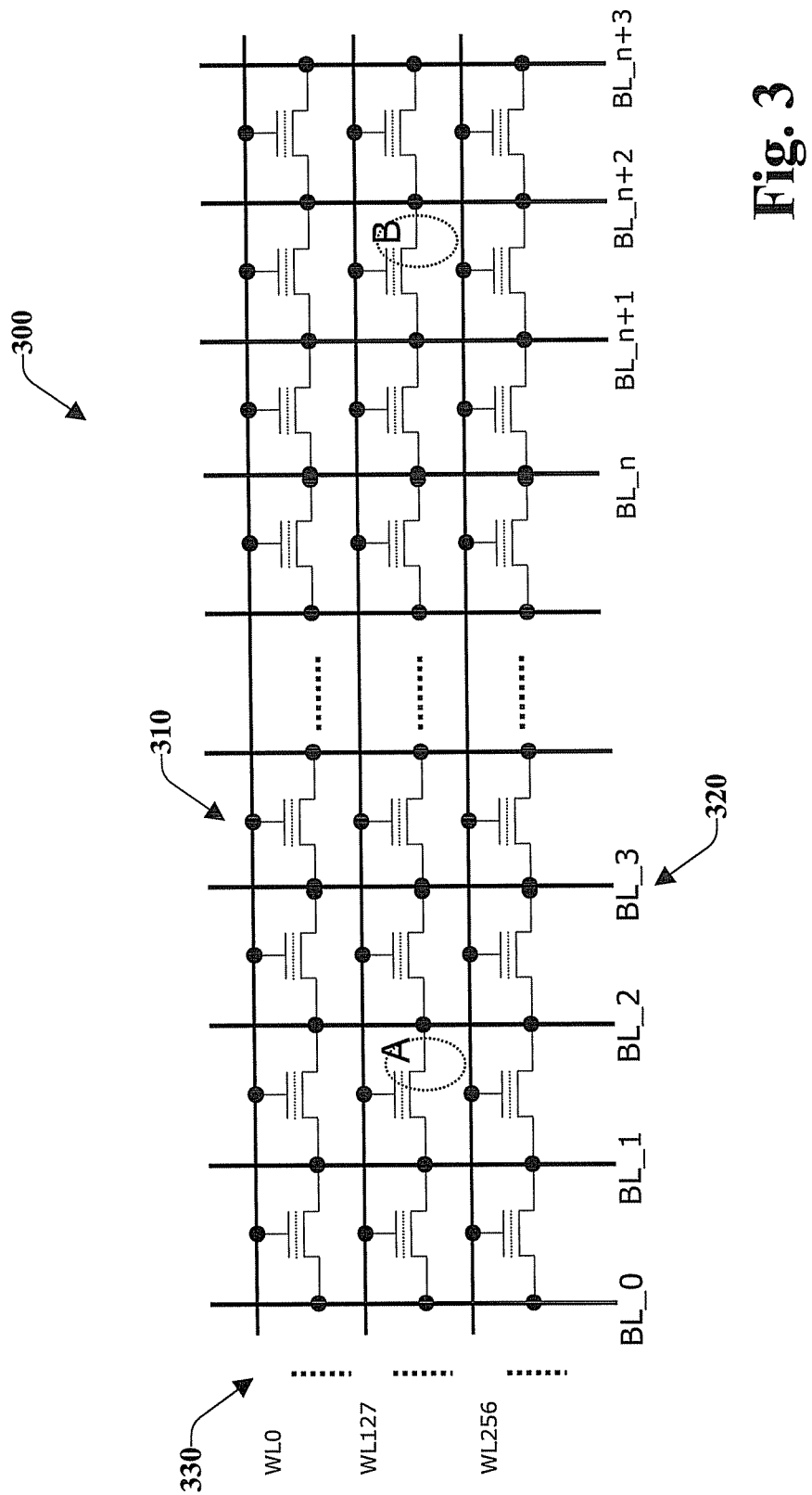
FIG. 3 illustrates an exemplary memory cell array architecture according to an aspect of the invention.

Referring now to FIG. 3, a cell array architecture 300 is depicted in accordance with an aspect of the subject disclosure. Cell array architecture 300 includes storage elements 310 that store a voltage to indicate a bit of data. For example, the storage element 310 can store one voltage to indicate a logical 1 and another voltage to indicate a logical 0. Storage elements 310 are arranged in words. A word is a unit of data that can be read as a single entity. For example, word 330 can be read as a single unit of data. That single unit of data will include the logical values stored in all storage elements 310 aligned in word 330. In addition to being associated with a word, each storage element 310 is associated with a bit line 320. Bit line 320 indicates the position of a storage element within word 330. For example, storage element 310 is the fourth bit in the first word in the cell array. Cell array architecture 300 can be implemented employing MirrorBit® architecture such that the same cell structure can be utilized for both NAND and NOR components. However, it is to be appreciated that other cell architectures can also be employed. For example, a silicon-oxide-nitride-oxide-silicon (SONOS) structure or a dual poly structure can be employed to achieve the benefits of the subject disclosure. That is, the SONOS structure or dual poly structure can be employed for one or both of the NAND and NOR components. The dual poly structure contains a control gate and floating gate made of polysilicon.

Figure 4:
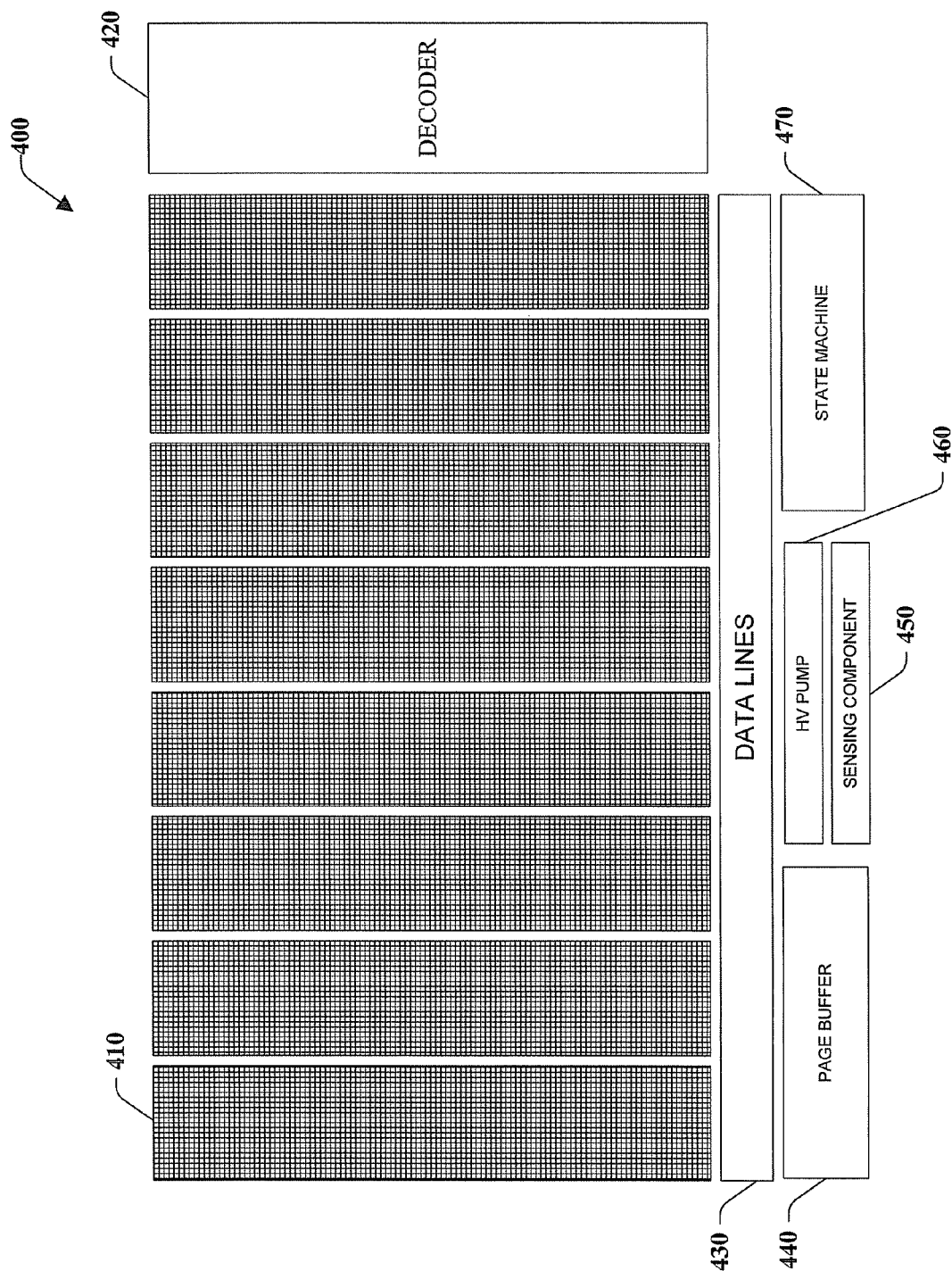
FIG. 4 illustrates a block diagram of an exemplary NAND memory chip design in accordance with one aspect of the invention.

Turning now to FIG. 4, an exemplary memory chip design 400 is illustrated. Memory chip design 400 implements a typical NAND memory. Memory chip design 400 includes memory bank 410 comprising a plurality of memory cells as described supra with reference to FIG. 3. Memory chip design 400 includes 8 memory banks indication a high density design suitable for mass storage. The high density structure limits the decoding surface to single decoder 420. Decoder 420 decodes an address to locate a particular portion of the memory bank 410. The decoder 420 receives an address for data from a requesting device. Decoder 420 decodes the address to determine an appropriate word line and optionally an appropriate bit line. Decoder 420 can activate the word line and bit line to isolate a memory storage element. For example, decoder 420 can activate word line 330 and bit line 320 to isolate storage element 310 from FIG. 3. After word line and bit line activation, the stored value in the isolated storage element can be retrieved. The retrieved bit, byte, or word can then be transmitted via data lines 430 to the requesting device.

Page buffer 440 provides write buffering functionality. Page buffer 440 speeds up programming operations for the NAND memory chip design 400. Page buffer 440 captures and stores several words prior to the actual writing into the memory bank 410. For example, the words can be sequential or contiguous so as to be programmed as a group or a block. Programming overhead can be balanced over all the words in the page buffer 440 that need to be programmed. This results in faster word programming.

Memory chip design 400 also includes a sensing component 450 and a high voltage pump 460. The high voltage pump 460 enables the memory chip design 400 to achieve voltages greater than the voltage supplied by the power supply. A larger voltage may be required for certain programming or erasure tasks. For example, a storage element within memory bank 410 may require a voltage of 10 volts to effectively program the storage element. However, the device employing the memory chip design 400 may only supply 5 volts. Accordingly, high voltage pump 460 boosts the voltage to a level required to program the storage element.

Sensing component 450 determines the logical value (e.g., "1" or "0") that is stored by a storage element in memory bank 410. The data signal from the storage element within memory bank 410 can be small or faint. Sensing component 450 amplifies the signal to produce a solid reading of the logical value. Subsequently, the amplified signal can be transmitted via the data lines 430. Memory chip design 400 further includes a state machine 470. State machine 470 can be a finite state automata or other such control system. State machine 470 provides control signals to other components of the memory chip design 400 based at least in part on a clock signal and a command signal. For example, signals to isolate a storage element (e.g., a word line signal and a bit line signal) may need to occur in a certain order and duration. State machine 470 enforces the requirements to enable isolation of the storage element.

Figure 5:
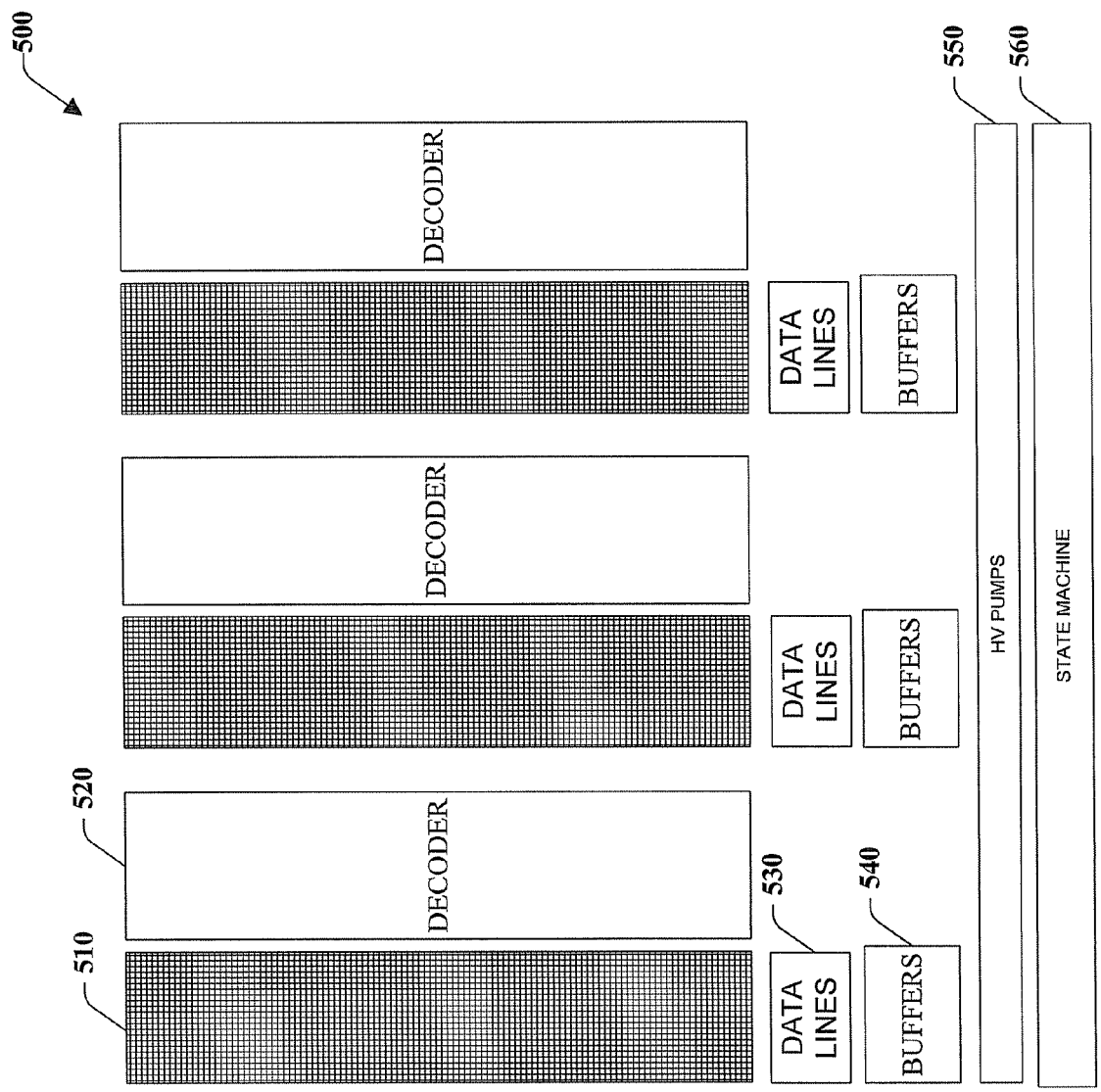
FIG. 5 a block diagram of an exemplary NOR memory chip design in accordance with one aspect of the invention.

Referring now to FIG. 5, a memory chip design 500 is depicted. Memory chip design 500 illustrates a typical NOR memory design. As FIG. 5 illustrates, in a typical NOR memory design, each memory bank is associated with a decoder. Memory bank 510 is associated with a decoder 520 that only operates with memory bank 510. The memory bank/decoder pairing architecture enables fast random access to the memory bank. Accordingly, NOR memory is suitable for code storage and execution. For example, NOR memory can be employed for execute-in-place (XIP) applications. Programs stored in NOR memory can be accessed and executed directly by a processor without the need to copy the code to RAM. Decoder 520 decodes an address into a specific word line and bit line to enable fast isolation and sensing of a storage element. The decoder 520 receives an address for data from a requesting device. Decoder 520 decodes the address to determine an appropriate word line and optionally an appropriate bit line. Decoder 520 can activate the word line and bit line to isolate a memory storage element. For example, decoder 520 can activate word line 330 and bit line 320 to isolate storage element 310 from FIG. 3. After word line and bit line activation, the stored value in the isolated storage element can be retrieved. The retrieved bit, byte, or word can then be transmitted via data lines 530 to the requesting device. The close association between memory bank 510 and decoder 520 enables signals from the decoder 520 to quickly isolate portion of memory to be read. Thus, non-sequential portions of memory bank 510 can be accessed without significant penalty.

Each memory bank 510 is also associated with separate data lines 530 and buffers 540. However, the memory banks share a common high voltage pump 550 and a state machine 560. High voltage pump 550 and state machine 560 are substantially similar to high voltage pump 460 and state machine 470 described with reference to FIG. 4. Additionally, HV pump 550 and state machine 560 provide the same functionality to NOR memory chip design 500 as HV pump 460 and state machine 470 provide to NAND memory chip design 400.

Figure 6:
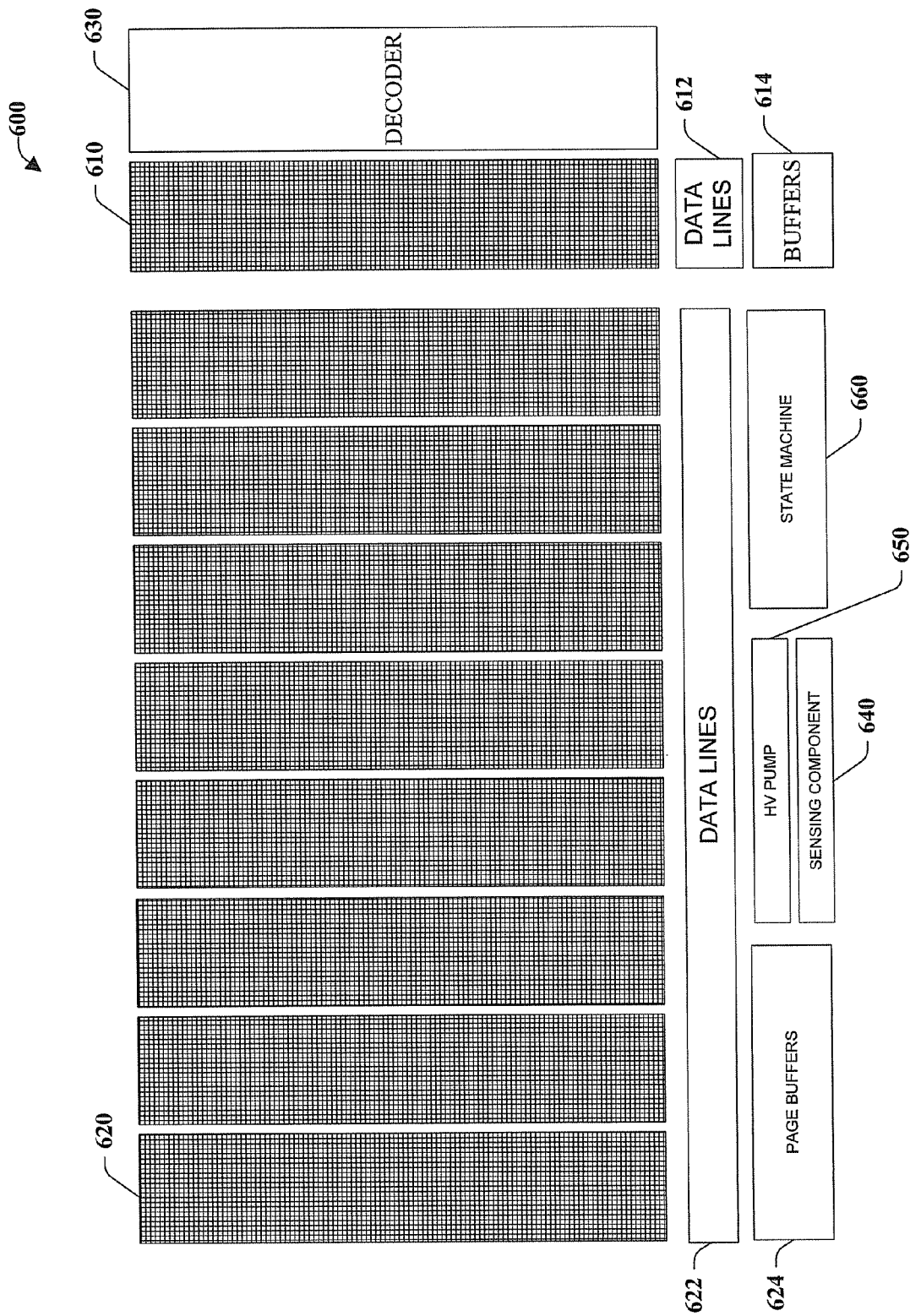
FIG. 6 illustrates a block diagram of a hybrid memory chip design in accordance with one aspect of the invention.

Turning to FIG. 6, a memory chip design 600 is depicted in accordance with an aspect of the subject disclosure. Memory chip design 600 is high density including nine memory banks total. It appears to be a NAND memory chip design but one of the nine banks is designated as a NOR memory bank. While FIG. 6 depicts only nine memory banks, it is to be appreciated that a greater or lesser number of memory banks can be employed depending on the particular application. Memory chip design 600 includes a NAND memory bank 620 and a NOR memory bank 610. Typically, the NOR memory bank 610 is designated as the bank closest to decoder 630. This design enables decoder signals to quickly isolate portions of memory bank 610 to provide fast random read access and achieve NOR memory functionality. For example, to read from memory bank 620, signals from decoder 630 travel the entire length of the array. The extra time required for the signals to travel negatively impacts read performance. Further, the high density design of memory chip 600 provides suitability for mass storage typically achieved in NAND memory devices.

NOR memory bank 610 and NAND memory bank 620 can be implemented with substantially similar cell structures and array architectures. For example, MirrorBit® cell structure enables NOR memory bank 610 and NAND memory bank 620 to be comprised of identical cell structures. In this situation, the additional component of chip design 600 provide the functional distinction between NOR memory bank 610 and NAND memory bank 620. For example, proximity to decoder 630, buffers and data buses provide distinctions between the two types of memory banks to achieve either NAND functionality or NOR functionality. It is to be appreciated that other cell structures and/or array architectures can be employed to achieve the benefits of the subject disclosure. For example, a SONOS cell structure can be utilized. With the SONOS cell structure, memory design 600 would include a portion of a SONOS NAND implementation and a portion of a SONOS NOR implementation.

NOR memory bank 610 is associated with NOR data lines 612 and NOR data buffers 614. Similarly, NAND memory bank 620 (and the other NAND memory banks) is associated with NAND data lines 622 and NAND page buffers 624. NAND data lines 622 and NOR data lines 612 are kept separate as NAND data lines 622 implement a low speed data bus and NOR data lines 612 implement a high speed data bus. Accordingly, to provide high speed random access, memory chip design 600 supplies NOR memory bank 610 with separate data lines 612. NAND data lines 622 and NOR data lines 612 are kept separate as NAND data lines 622 implement a low speed data bus and NOR data lines 612 implement a high speed data bus. Accordingly, to provide high speed random access, memory chip design 600 supplies NOR memory bank 610 with separate data lines 612.

NAND memory bank 620 is associated with page buffers 624. All NAND memory banks share page buffers 624. Page buffer 624 provides write buffering functionality. Page buffer 624 speeds up programming operations for the NAND memory bank 620. Page buffer 624 captures and stores several words prior to the actual writing into the memory bank 620. For example, the words can be sequential or contiguous so as to be programmed as a group or a block. Programming overhead can be balanced over all the words in the page buffer 624 that need to be programmed. This results in faster word programming. Additionally, page buffers 624 can be employed in read operations. NAND memory bank 620 is typically read a page at a time. A page is a block of memory comprised of a plurality of words. A page, for example, can be 512 bytes. It is to be appreciated that a page can be many other sizes depending on implementation and application. Since page buffers 624 are designed for NAND operations (i.e., data reads a page at a time), they are not suitable for random access reads provided by NOR memory bank 610. Accordingly, NOR memory bank 610 is supplied with data buffers 614 to provide random access read buffering functionality.

NAND memory bank 620 is further associated with a sensing component 640. Sensing component 640 determines the logical value (e.g., "1" or "0") that is stored by a storage element in NAND memory bank 620. The data signal from the storage element within memory bank 620 can be small or faint. Sensing component 640 amplifies the signal to produce a solid reading of the logical value. Subsequently, the amplified signal can be transmitted via the data lines 622.

State machine 660 can be a finite state automata or other such control system. State machine 660 provides control signals to other components of the memory chip design 600 based at least in part on a clock signal and a command signal. For example, signals to isolate a storage element (e.g., a word line signal and a bit line signal) may need to occur in a certain order and duration. State machine 660 enforces the requirements to enable isolation of the storage element. State machine 660 provides different control logic to access the NAND memory bank 620 and the NOR memory bank 620. As operations performed on the memory are different, the process or steps taken to achieve the operation are different. For example, when reading from both types of memory, different steps and control signals are required to accomplish a read on a page basis (NAND) than are required to perform a random access read (NOR).

Both the NAND memory bank 620 and the NOR memory bank 610 share a high voltage pump 650 and a state machine 660. The high voltage pump 650 enables the memory chip design 600 to achieve voltages greater than the voltage supplied by the power supply. A larger voltage may be required for certain programming or erasure tasks. For example, a storage element within memory bank 620 may require a voltage of 12 volts to effectively program the storage element. However, the device employing the memory chip design 600 may only supply 4 volts. Accordingly, high voltage pump 650 boosts the voltage to a level required to program the storage element.

Figure 7:
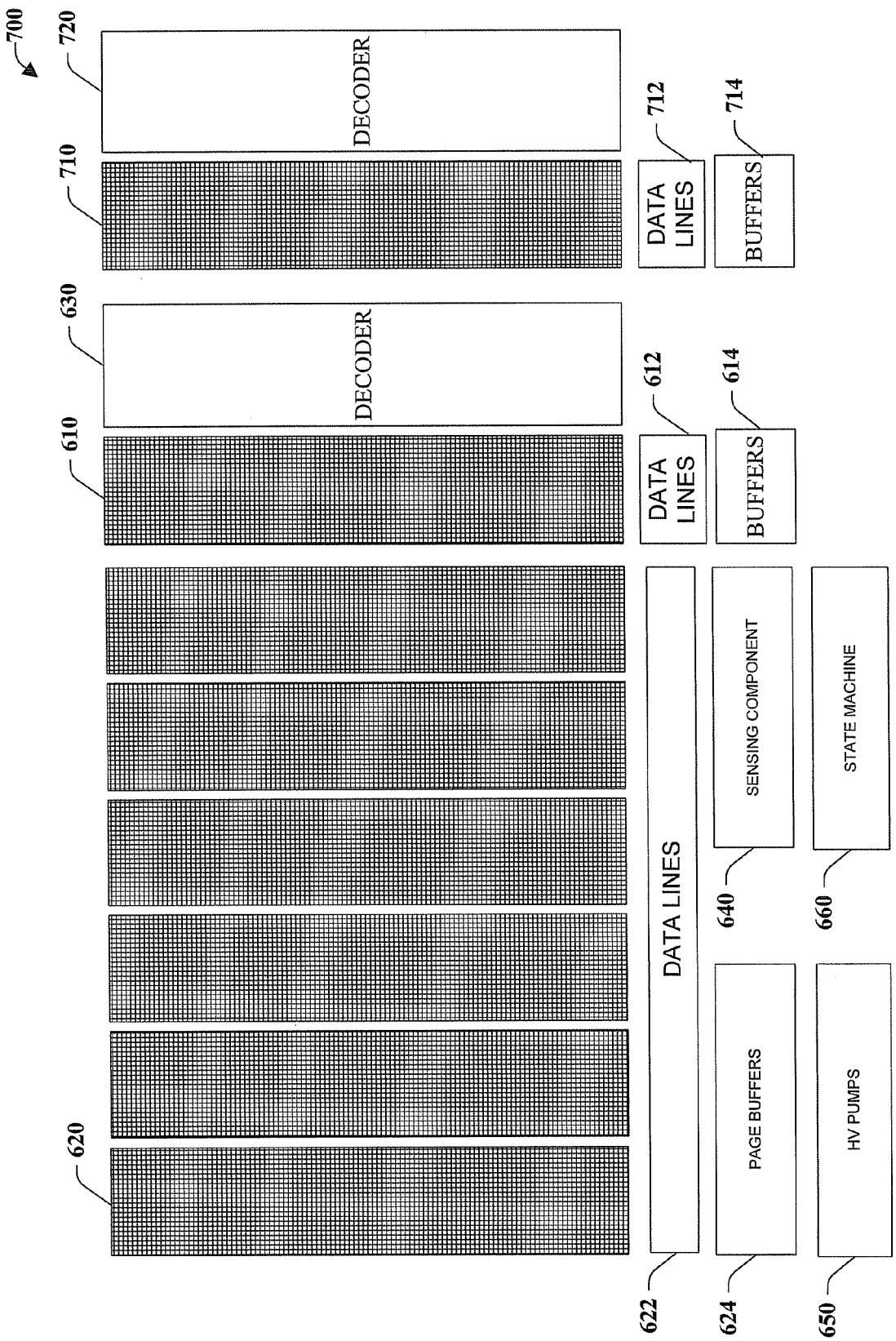
FIG. 7 illustrates a block diagram of a hybrid memory chip design with a duplicated NOR structure in accordance with one aspect of the invention.

Referring to FIG. 7, a memory chip design 700 is illustrated in accordance with an aspect of the subject disclosure. Depending on a desired application for a NAND/NOR combination memory device, additionally NOR memory code storage may be required. According to one aspect of the subject disclosure, the NOR structure of the combined memory device can be duplicated to achieve greater code storage capacity. Memory chip design 700 includes a first NOR memory bank 610, first NOR data lines 612 and first NOR data buffers 614. These components are similar to the corresponding components described supra with reference to FIG. 6. Further, memory chip design 700 includes NAND memory bank 620, NAND data lines 622, NAND page buffers 624, NAND sensing component 640, shared high voltage pump 650 and shared state machine 660 as described supra with reference to FIG. 6.

Additionally, memory chip design 700 includes a second NOR memory bank 710, second NOR data lines 712, second NOR data buffers 714 and an additional decoder 720. The duplicated NOR components 710-714 are substantially similar to the first NOR components 610-614. Further, decoder 720 provides the same functionality as decoder 630 but decoder 720 is only associated with second NOR memory bank 710 so that NOR memory bank 710 can be randomly accessed with the same efficiency as NOR memory bank 610. It is to be appreciated that the NOR structure can be duplicated as many times as necessary to meet the needs of a particular application. This duplication results in a continuum of implementations of the subject innovation. For example, at one end of the continuum is a typical NAND memory device as described with reference to FIG. 4. A single NOR structure can be introduced therein to produce the memory chip design illustrated in FIG. 6. A second NOR structure can be added resulting in the implementation depicted by FIG. 7. Additional NOR structures can be similarly introduced, each time reducing the size of the NAND component, until a typical NOR memory device similar to that illustrated in FIG. 5 results.

The aforementioned systems, architectures and the like have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component to provide aggregate functionality. Communication between systems, components and/or sub-components can be accomplished in accordance with either a push and/or pull model. The components may also interact with one or more other components not specifically described herein for the sake of brevity, but known by those of skill in the art.

Figure 8:
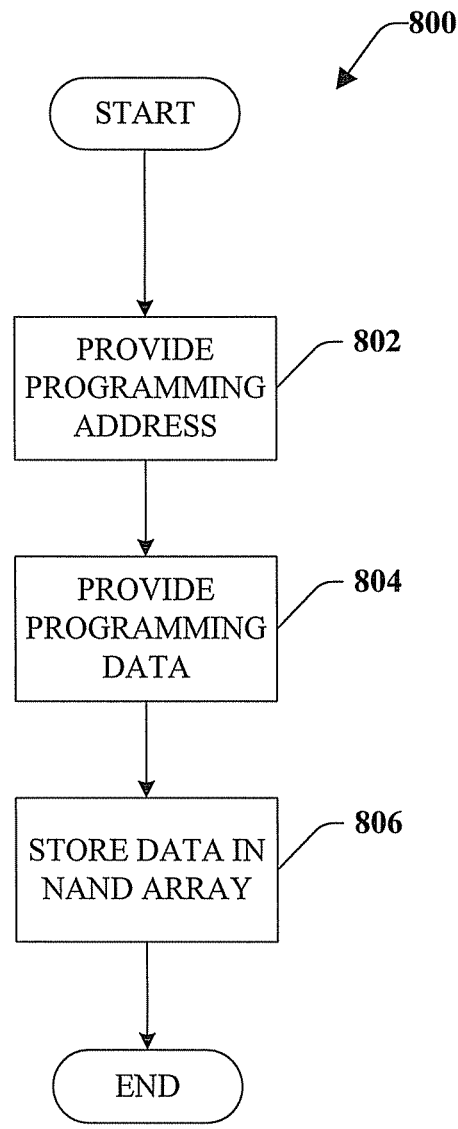
FIG. 8 illustrates a flow chart of a method of employing a NAND memory device in accordance with an aspect of the invention.
Figure 9:
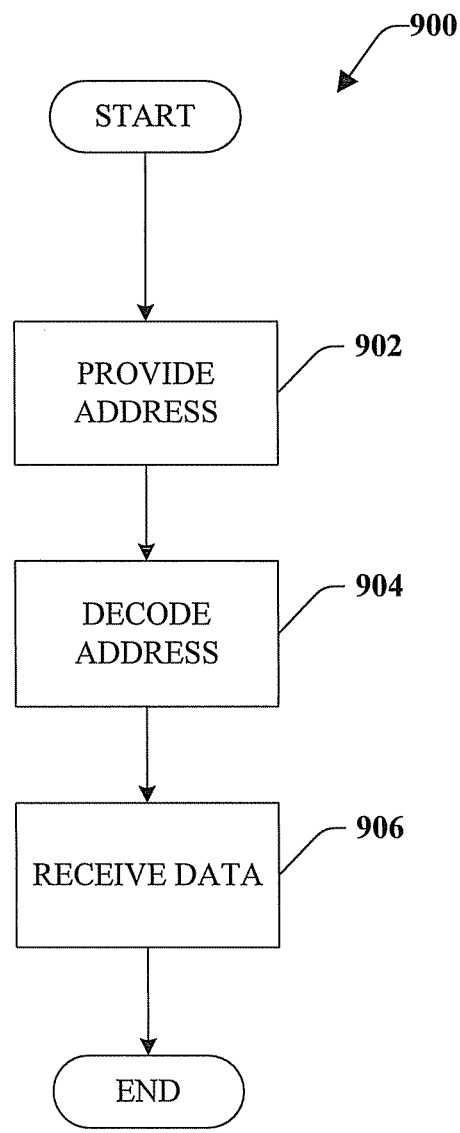
FIG. 9 illustrates a flow chart of a method of employing a NOR memory device in accordance with an aspect of the invention.
Figure 10:
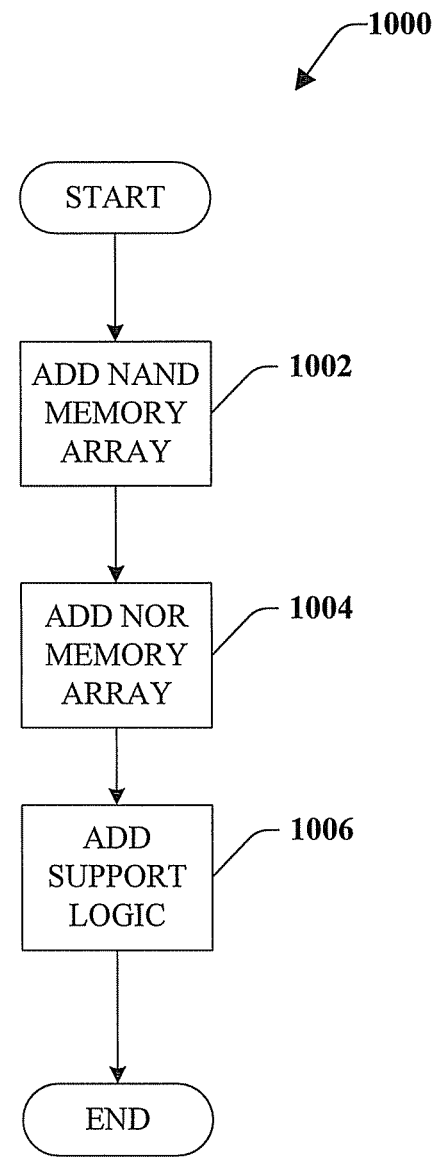
FIG. 10 illustrates a flow chart of a method of creating a hybrid memory device in accordance with an aspect of the invention.

In view of the exemplary systems described supra, methodologies that may be implemented in accordance with the disclosed subject matter will be better appreciated with reference to the flow charts of FIGS. 8-10. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

Referring to FIG. 8, an exemplary methodology 800 for employing a NAND memory device is depicted. At reference numeral 802, a programming address is provided. The programming address indicates a portion of memory that is to be programmed and/or erased. The programming address can be a particular storage element address or a page address. The page address may contain a starting location of a page and a size of the page. At 804, the programming data is provided. The data can be provided in blocks that are stored in a buffer until a full page is reached. At 806, the data is stored in the NAND memory device. Individual storage elements of the NAND memory device are programmed to store the logical value of a bit of the data.

Turning now to FIG. 9, an exemplary methodology 900 for employing a NOR memory device is depicted. At reference numeral 902, an address is provided. The address can specify any location within the NOR memory device. In particular, the address can specify a location non-contiguous with a previously requested address. Further, the address can be for a word of data or a particular bit of data. At 904, the address provided at 902 is decoded. The address is decoded to determine the appropriate word line and optionally the appropriate bit line wherein the requested data is stored. For example, if the address specifies a particular word of data, the address is decoded to provide a signal activating the word line wherein the particular word of data is stored. If the address specifies a particular bit of data, an additional signal is provided to activate a corresponding bit line of the word to isolate the particular bit of data. At numeral 906, the logical values of the storage elements of the NOR memory device at the provided address are read and the data is returned to the requesting entity providing the address at 902.

Turning now to FIG. 10, a methodology 1000 for creating a NAND/NOR combination memory device is depicted. At reference numeral 1000, a NAND memory array is added. The NAND memory array comprises multiple memory banks to provide high density mass storage. The NAND memory array is suitable for operations as described with reference to FIG. 8. At 1004, a NOR memory array is added. The NOR memory array is lower density but is closely associated with a decoder to provide fast random read access suitable for code storage. The NOR memory array can perform operations as described with reference to FIG. 9. At reference numeral 1006, support logic is added to fully implement the functionality of the NAND memory array and the NOR memory array.

As used in this application, the terms "component," "handler," "model," "system," and the like are intended to refer to a computer-related entity, either hardware, a combination of hardware and software, software, or software in execution. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components may reside within a process and/or thread of execution and a component may be localized on one computer and/or distributed between two or more computers.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A semiconductor memory, comprising:
   a plurality of non-volatile memory banks, wherein each non-volatile memory bank comprises an array of storage cells, the plurality of non-volatile memory banks including:
   a first memory bank associated with a dedicated data bus and a set of dedicated buffers, wherein the first memory bank operates as a NOR-type memory bank configured to provide random access reading of data from the first memory bank to facilitate storage of programming code and execution of the programming code, and
   plurality of remaining memory banks comprising memory banks of the plurality of memory banks absent at least the first memory bank, the plurality of remaining memory banks being associated, collectively, with a shared data bus and a set of shared buffers, wherein the plurality of remaining memory banks operate as NAND-type memory banks configured to facilitate performance of data write operations and mass storage of data; and
   a shared decoder configured to be associated with the plurality of non-volatile memory banks, decode respective addresses associated the plurality of non-volatile memory banks, and be located in closer proximity, on a semiconductor chip of the semiconductor memory, to the first memory bank, as compared to respective proximities of respective remaining memory banks of the plurality of remaining memory banks, to facilitate the random access reading of the data from the first memory bank, wherein the dedicated data bus associated with the first memory bank is configured to be isolated from the shared data bus such that the dedicated data bus is not directly and not indirectly communicatively connected to the shared data bus.

2. The semiconductor memory of claim 1, wherein the first memory bank stores programming code related to at least one of firmware, a boot loader, an operating system, or a software application.

3. The semiconductor memory of claim 1, wherein the first memory bank is further configured to enable execute-in-place functionality.

4. The semiconductor memory of claim 1, wherein the arrays of storage cells associated with the plurality of non-volatile memory banks have an identical architecture.

5. The semiconductor memory of claim 1, wherein the dedicated data bus comprises a dedicated high-speed data bus employed by the first memory bank and connected to the shared decoder, and the shared data bus comprises a shared low-speed data bus employed by the plurality of remaining memory banks and connected to the shared decoder, wherein the dedicated high-speed data bus has a faster data transmission rate than the shared low-speed data bus.

6. The semiconductor memory of claim 1, wherein the dedicated data bus and the first memory bank are further configured to be isolated from the shared data bus such that the first memory bank is not directly communicatively connected to the shared data bus wherein decoder signals from the shared decoder component to the first memory bank are communicated via the dedicated data bus without being communicated via the shared data bus to facilitate reducing an amount of time to access the first memory bank.

7. The semiconductor memory of claim 1, wherein the set of dedicated buffers are exclusively associated with the first memory bank.

8. The semiconductor memory of claim 1, wherein the set of shared buffers associated with the plurality of remaining memory banks, are isolated from the set of dedicated buffers associated with the first memory bank.

9. The semiconductor memory of claim 1, wherein the set of dedicated buffers is a set of dedicated data buffers configured to facilitate random access read buffering operations, and the set of shared buffers is a set of shared page buffers configured to facilitate NAND operations, including data reads of a page at a time, in relation to the plurality of remaining memory banks.

10. An electronic device comprising the semiconductor memory of claim 1.

11. The semiconductor memory of claim 1, wherein the plurality of non-volatile memory banks further includes a second memory bank configured to operate as a NOR-type memory bank to provide additional code storage.

12. The semiconductor memory of claim 11, further comprising a second dedicated data bus and a second set of dedicated buffers associated with the second memory bank configured to operate as a NOR-type memory bank, wherein the second dedicated data bus and the second set of buffers are separate from the dedicated data bus and the set of dedicated buffers associated with the first memory bank, and separate from the shared data bus and the set of shared buffers.

13. The semiconductor memory of claim 1, further comprising a state machine configured to control at least one of a read operation, a programming operation, or an erasure operation on the plurality memory banks.

14. The semiconductor memory of claim 13, wherein the state machine provides control logic for operations on the first memory bank that differs from control logic for operations on the plurality of remaining memory banks.

15. A method for a hybrid memory device, comprising:
   receiving an address associated with an operation on the hybrid memory device, wherein the hybrid memory device comprises a plurality of non-volatile memory banks, wherein non-volatile memory banks of the plurality of non-volatile memory banks respectively comprise an array of storage cells and wherein the plurality of non-volatile memory banks comprises a first memory bank configured to operate as a NOR-type memory bank and a subset of other memory banks configured to operate as NAND-type memory banks;

accessing the subset of other memory banks to perform the operation in response to the address indicating a location within the subset of other memory banks, wherein the subset of other memory banks is associated with a shared data bus and a set of page buffers that are shared by the subset of other memory banks to facilitate using the subset of other memory banks for write operations to facilitate mass storage of data;

accessing the first memory bank to perform the operation in response to the address indicating a location within the first memory bank, wherein the first memory bank is associated with a dedicated data bus and a set of dedicated buffers to facilitate performing read operations using the first memory bank;

forming the first memory bank in a location on a semiconductor chip of the hybrid memory device that is in closer proximity to a shared decoder, as compared to respective proximities of respective remaining memory banks to the shared decoder, to facilitate the random access reading of the data from the first memory bank;

connecting the shared decoder to the plurality of non-volatile memory banks to facilitate decoding addresses, including the address, associated with the plurality of non-volatile memory banks; and configuring the dedicated data bus associated with the first memory bank to be isolated from the shared data bus such that the dedicated data bus is not directly communicatively connected to the shared data bus.

16. The method of claim 15, further comprising accessing the first memory bank to directly execute stored software code.

17. The method of claim 15, wherein the operation includes at least one of a read operation, a write operation, or an erase operation.

18. The method of claim 15, further comprising:

accessing the subset of other memory banks when the operation is one of a write operation or an erase operation; and accessing the first memory bank when the operation is a random access read operation.

19. A hybrid memory device, comprising:

a shared decoder configured to decode a memory address to activate a particular storage location within the hybrid memory device;

a first memory bank, of a plurality of memory banks, wherein the first memory bank is configured to be located physically closest, on a semiconductor chip of the hybrid memory device, to the shared decoder, in relation to respective physical locations of a subset of other memory banks, and wherein the first memory bank operates as a NOR-type memory bank to facilitate random access seeks and reads of first data stored in the first memory bank;

a dedicated buffer associated with the first memory bank;

a dedicated data bus associated with the first memory bank;

the subset of other memory banks, comprising one or more memory banks of the plurality of memory banks except for the first memory bank, wherein the subset of other memory banks being configured to operate as a NAND-type memory bank to facilitate mass data storage and operations on second data associated with the subset of other memory banks;

a shared page buffer associated with the set of memory banks, wherein the shared page buffer being separate and isolated from the dedicated buffer; and a shared data bus associated with the subset of other memory banks, the shared data bus being separate and isolated from the dedicated data bus such that the dedicated data bus is not directly connected to the shared data bus, wherein each memory bank of the plurality of memory banks comprises an array of storage cells.

20. The hybrid memory device of claim 19, wherein access to the subset of other memory banks occurs via the shared data bus and access to the first memory bank occurs via the dedicated data bus.

* * * * *